US012707662B2

(12) United States Patent
Yang et al.

(10) Patent No.: US 12,707,662 B2
(45) Date of Patent: Aug. 11, 2026

(54) IGBT MODULE, MOTOR CONTROLLER, AND VEHICLE

(71) Applicant: BYD COMPANY LIMITED, Shenzhen (CN)

(72) Inventors: Guangming Yang, Shenzhen (CN); Axi Qi, Shenzhen (CN); Xingchun Zhang, Shenzhen (CN); Yilong Yu, Shenzhen (CN); Fengchuan Yu, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 386 days.

(21) Appl. No.: 18/372,387

(22) Filed: Sep. 25, 2023

(65) Prior Publication Data

US 2024/0021714 A1 Jan. 18, 2024

Related U.S. Application Data

(63) Continuation of application No. PCT/CN2022/077470, filed on Feb. 23, 2022.

(30) Foreign Application Priority Data

Apr. 28, 2021 (CN) ......................... 202110466720.7

(51) Int. Cl.
*H10D 12/00* (2025.01)
*H05K 7/20* (2006.01)
(Continued)

(52) U.S. Cl.
CPC ....... *H10D 12/411* (2025.01); *H05K 7/20927* (2013.01); *H10W 40/228* (2026.01); *H10W 42/00* (2026.01); *H10W 70/438* (2026.01)

(58) Field of Classification Search
CPC ..... H01L 23/552; H01L 23/051; H01L 23/10; H01L 23/4334; H01L 23/473;
(Continued)

(56) References Cited

U.S. PATENT DOCUMENTS

| | | | |
|---|---|---|---|
| 2018/0082925 A1 | 3/2018 | Grassmann et al. | |
| 2018/0254235 A1 | 9/2018 | Tsuyuno et al. | |

(Continued)

FOREIGN PATENT DOCUMENTS

| | | |
|---|---|---|
| CN | 103348468 A | 10/2013 |
| CN | 103597729 A | 2/2014 |

(Continued)

OTHER PUBLICATIONS

International Search Report and Written Opinion for Application No. PCT/CN2022/077470, mailed on Apr. 22, 2022, 8 pages.

(Continued)

*Primary Examiner* — Steven B Gauthier
*Assistant Examiner* — Marc-Anthony Armand
(74) *Attorney, Agent, or Firm* — Sheppard Mullin Richter & Hampton LLP

(57) ABSTRACT

An insulated gate bipolar transistor (IGBT) assembly includes a wafer; a first heat dissipation plate and a second heat dissipation plate being disposed on two surfaces of the wafer in a thickness direction of the wafer respectively, a plurality of first heat dissipation pins being disposed at an interval from each other on a surface of the first heat dissipation plate facing away from the second heat dissipation plate, and a plurality of second heat dissipation pins being disposed at an interval from each other on a surface of the second heat dissipation plate facing away from the first heat dissipation plate; and an insulating waterproof housing covering a portion of the wafer exposed from the first heat dissipation plate and the second heat dissipation plate.

19 Claims, 9 Drawing Sheets

(51) Int. Cl.
*H10W 40/22* (2026.01)
*H10W 42/00* (2026.01)
*H10W 70/40* (2026.01)

(58) Field of Classification Search
CPC ... H01L 23/057; H01L 23/367; H01L 25/072; H01L 25/115; H01L 25/18; H10W 40/47; H10W 40/778; H10W 40/22; H10W 42/20; H10W 90/26; H10W 90/297; H10W 90/00; H10W 76/157; H10W 76/138
See application file for complete search history.

(56) References Cited

U.S. PATENT DOCUMENTS

| | | | | |
|---|---|---|---|---|
| 2020/0227333 | A1 | 7/2020 | Tsuyuno et al. | |
| 2020/0388556 | A1* | 12/2020 | Tsuyuno | H02M 7/003 |
| 2021/0212242 | A1* | 7/2021 | Moreno | F28F 3/12 |

FOREIGN PATENT DOCUMENTS

| | | | |
|---|---|---|---|
| CN | 106098655 | A | 11/2016 |
| CN | 107408554 | A | 11/2017 |
| CN | 111373524 | A | 7/2020 |
| JP | 2004-297033 | A | 10/2004 |
| JP | 2009159815 | A | 7/2009 |
| JP | 2011-217546 | A | 10/2011 |
| JP | 2013243323 | A | 12/2013 |
| JP | 2019-149560 | A | 9/2019 |
| WO | 2013/105332 | A1 | 7/2013 |
| WO | 2018159209 | A1 | 9/2018 |
| WO | 2021/010210 | A1 | 1/2021 |

OTHER PUBLICATIONS

First Examination Report dated Sep. 11, 2025, issued in Indian Patent Application No. 202327064664, with English machine translation (5 pages).
Office Action and Search Report dated Oct. 30, 2025, issued in Brazilian Patent Application No. 112023021934-5, with English machine translation (8 pages).
First Office Action and Search Report dated Jul. 19, 2024, issued in Chinese Patent Application No. 202110466720.7, with English machine translation (15 pages).
Second Office Action dated Oct. 17, 2024, issued in Chinese Patent Application No. 202110466720.7, with English machine translation (14 pages).
Extended European Search Report dated Sep. 30, 2024, issued in European Patent Application No. 22794306.5 (9 pages).
Examination Report No. 1 dated Jul. 8, 2024, issued in Australian Patent Application No. 2022264526 (3 pages).

* cited by examiner

IGBT MODULE, MOTOR CONTROLLER, AND VEHICLE

CROSS-REFERENCE TO RELATED APPLICATIONS

This application is a Continuation Application of International Patent Application No. PCT/CN2022/077470, filed on Feb. 23, 2022, which is based on and claims priority to and benefits of Chinese Patent Application No. 202110466720.7, filed on Apr. 28, 2021. The entire content of all of the above-referenced applications is incorporated herein by reference.

FIELD

The present disclosure relates to the technical field of vehicles, and more particularly, to an insulated gate bipolar transistor (IGBT) module/assembly, a motor controller, and a vehicle.

BACKGROUND

An IGBT module in related art usually includes a wafer and a heat dissipation plate. The heat dissipation plate is in contact with a side of the wafer for dissipating heat of the wafer. However, since the wafer only radiates heat from a single side, the heat dissipation effect is poor, resulting in difficulty in improving power density of the wafer. Therefore, in some IGBT modules, heat dissipation plates are arranged on two opposite sides of the wafer, which changes the heat dissipation of the wafer from a single side to two sides to improve the power density of the wafer. However, the two heat dissipation plates and the wafer of these IGBT modules are not reasonably arranged, resulting in low connection stability between the two heat dissipation plates and the wafer, and poor sealing effect. As a result, conventional IGBT modules have low electrical connection reliability.

SUMMARY

The present disclosure resolves at least some of the technical problems in the related art. The present disclosure provides an IGBT module/assembly, which not only can perform double-sided heat dissipation with a high heat dissipation efficiency, but also has the advantages of reliable connection, good sealing effect, and the like.

The present disclosure further provides a motor controller having the foregoing IGBT module/assembly.

The present disclosure further provides a vehicle having the foregoing motor controller.

According to an embodiment of a first aspect of the present disclosure, an IGBT assembly is provided, which includes a wafer; a first heat dissipation plate and a second heat dissipation plate being disposed on two surfaces of the wafer in a thickness direction of the wafer respectively, multiple first heat dissipation pins being disposed at an interval from each other on a surface of the first heat dissipation plate facing away from the second heat dissipation plate, and multiple of second heat dissipation pins being disposed at an interval from each other on a surface of the second heat dissipation plate facing away from the first heat dissipation plate; and an insulating waterproof housing covering a portion of the wafer exposed from the first heat dissipation plate and the second heat dissipation plate.

The IGBT module according to this embodiment of the present disclosure not only can perform double-sided heat dissipation with a high heat dissipation efficiency, but also has the advantages of reliable connection, good sealing effect, and the like.

According to some embodiments of the present disclosure, a first insulating and thermally-conductive sheet is disposed between the first heat dissipation plate and the wafer. A second insulating and thermally-conductive sheet is disposed between the second heat dissipation plate and the wafer.

According to some embodiments of the present disclosure, a direct-current connection member connected to a first end of the wafer and protruding from a first side of the insulating waterproof housing, and an alternating-current connection member connected to a second end of the wafer and protruding from a second side of the insulating waterproof housing.

According to some embodiments of the present disclosure, the direct-current connection member includes a first direct-current negative input copper bar, a direct-current positive input copper bar, and a second direct-current negative input copper bar. The alternating-current connection member includes an alternating-current output copper bar. A signal lead is disposed at the second end of the wafer.

According to some embodiments of the present disclosure, the IGBT module further includes: an axial waterproof member disposed on an end face of the first side of the insulating waterproof housing, and extending along an axial direction of the end face; and a radial waterproof member disposed on an outer circumferential surface of the second side of the insulating waterproof housing, and extending along a circumferential direction of the outer circumferential surface.

According to some embodiments of the present disclosure, an annular groove is formed in the end face of the first side of the insulating waterproof housing, and the axial waterproof member is disposed in the annular groove. The radial waterproof member and the insulating waterproof housing are integrally molded.

According to some embodiments of the present disclosure, at least one of the first heat dissipation plate and the second heat dissipation plate includes support ribs, the support ribs are disposed between the first heat dissipation plate and the second heat dissipation plate, to form an accommodating cavity between the first heat dissipation plate and the second heat dissipation plate. The wafer is disposed in the accommodating cavity.

According to some embodiments of the present disclosure, the support ribs are disposed on one of the first heat dissipation plate and the second heat dissipation plate, a limiting rib is disposed on each of the support ribs and extends along a length direction of the support rib, a width of the limiting rib is less than a width of a support rib, the other one of the first heat dissipation plate and the second heat dissipation plate includes limiting grooves, and the limiting ribs are coupled with the limiting grooves.

According to some embodiments of the present disclosure, the support ribs are disposed on two opposite edge portions of the second heat dissipation plate and extend along a length direction of the two opposite edges. A first end of each of the support ribs is configured with a bent portion extending along a first edge of the second heat dissipation plate adjacent to the two opposite edges of the second heat dissipation plate on which the support rib is located, and a second end of each of the support ribs is spaced from a second edge of the second heat dissipation plate adjacent to the two opposite edges of the second heat dissipation plate on which the support rib is located.

According to some embodiments of the present disclosure, a first sunk groove is formed in the surface of the first heat dissipation plate facing away from the second heat dissipation plate. The first sunk groove extends along a circumferential direction of an outer circumference of the first heat dissipation plate. A second sunk groove is formed in the surface of the second heat dissipation plate facing away from the first heat dissipation plate. The second sunk groove extends along a circumferential direction of an outer circumference of the second heat dissipation plate. The insulating waterproof housing is fitted in the first sunk groove and the second sunk groove.

According to some embodiments of the present disclosure, an outer surface of the wafer is coated with an insulating heat dissipation layer.

According to an embodiment of a second aspect of the present disclosure, a motor controller is provided, the motor controller including: a liquid-cooling housing, a cooling cavity being defined in the liquid-cooling housing, the liquid-cooling housing including a liquid inlet and a liquid outlet in communication with the cooling cavity, and a lead-in hole and a lead-out hole being disposed in two opposite side walls of the liquid-cooling cavity respectively; and an IGBT assembly according to the embodiment of the first aspect of the present disclosure, the IGBT assembly being inserted into the cooling cavity through the lead-in hole and extended out of the cooling cavity through the lead-out hole, a liquid gap being formed between an inner wall of the cooling cavity and one of two opposite side surfaces of the IGBT assembly in a thickness direction. Two ends of the IGBT assembly being sealed with the liquid-cooling housing to close the lead-in hole and the lead-out hole.

The motor controller according to this embodiment of the present disclosure, by employing the IGBT assembly according to the embodiment of the first aspect of the present disclosure, not only can perform double-sided heat dissipation with high heat dissipation efficiency, but also has the advantages of reliable connection, good sealing effect, and the like.

According to an embodiment of a third aspect of the present disclosure, a vehicle is provided, the vehicle including: a motor controller according to the embodiment of the second aspect of the present disclosure.

The vehicle according to this embodiment of the present disclosure, by employing the motor controller according to the embodiment of the second aspect of the present disclosure, has the advantages of good heat dissipation, reliable electrical connection, and the like.

The additional aspects and advantages of the present disclosure will be provided in the following description, some of which will become apparent from the following description or may be learned from practices of the present disclosure.

BRIEF DESCRIPTION OF THE DRAWINGS

The foregoing and/or additional aspects and advantages of the present disclosure will become apparent and comprehensible from the following descriptions of the embodiments with reference to the accompanying drawings, where.

REFERENCE NUMERALS

Figure 1:
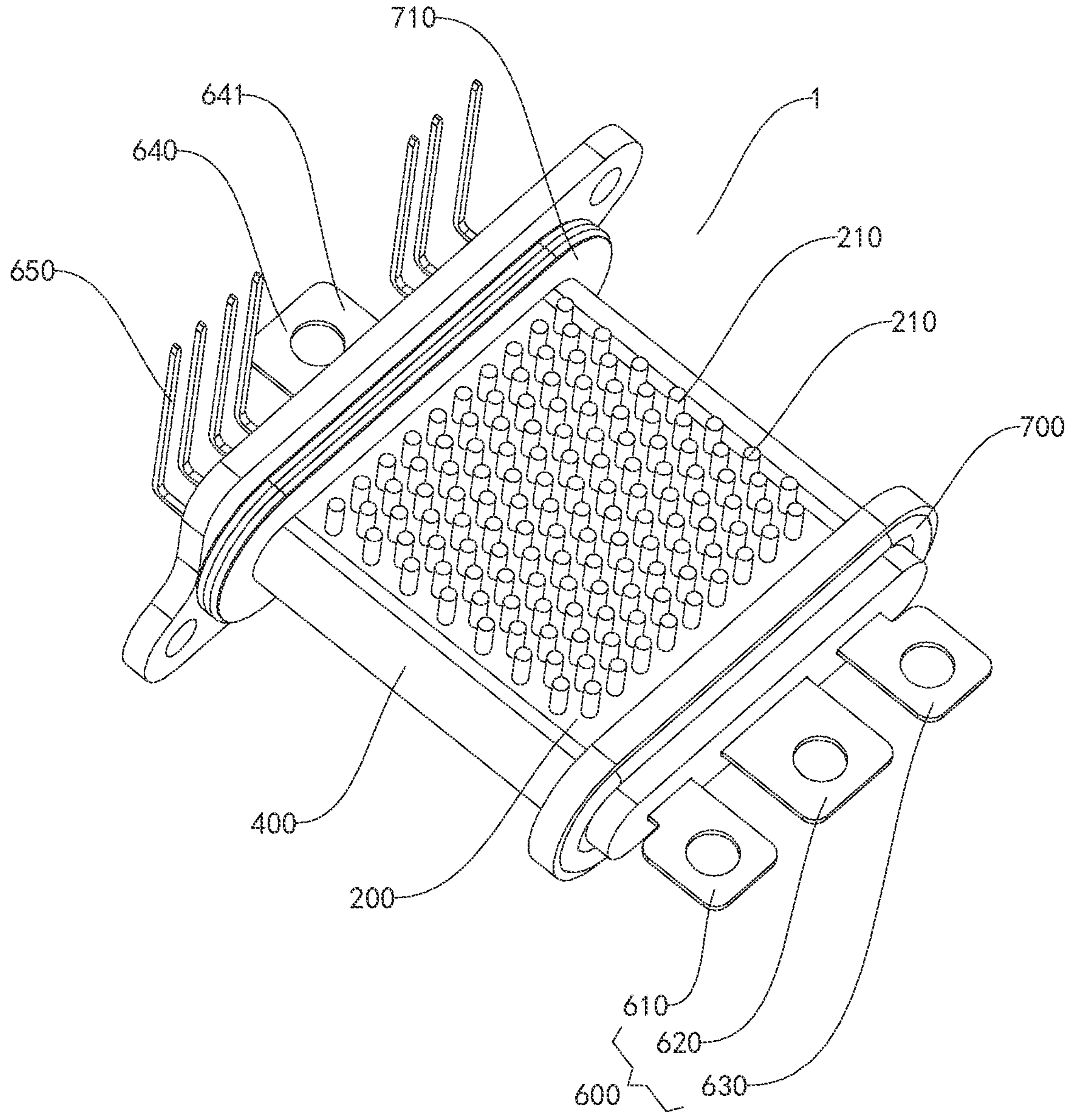
FIG. 1 is a schematic structural diagram of an IGBT module according to an embodiment of the present disclosure.
Figure 2:
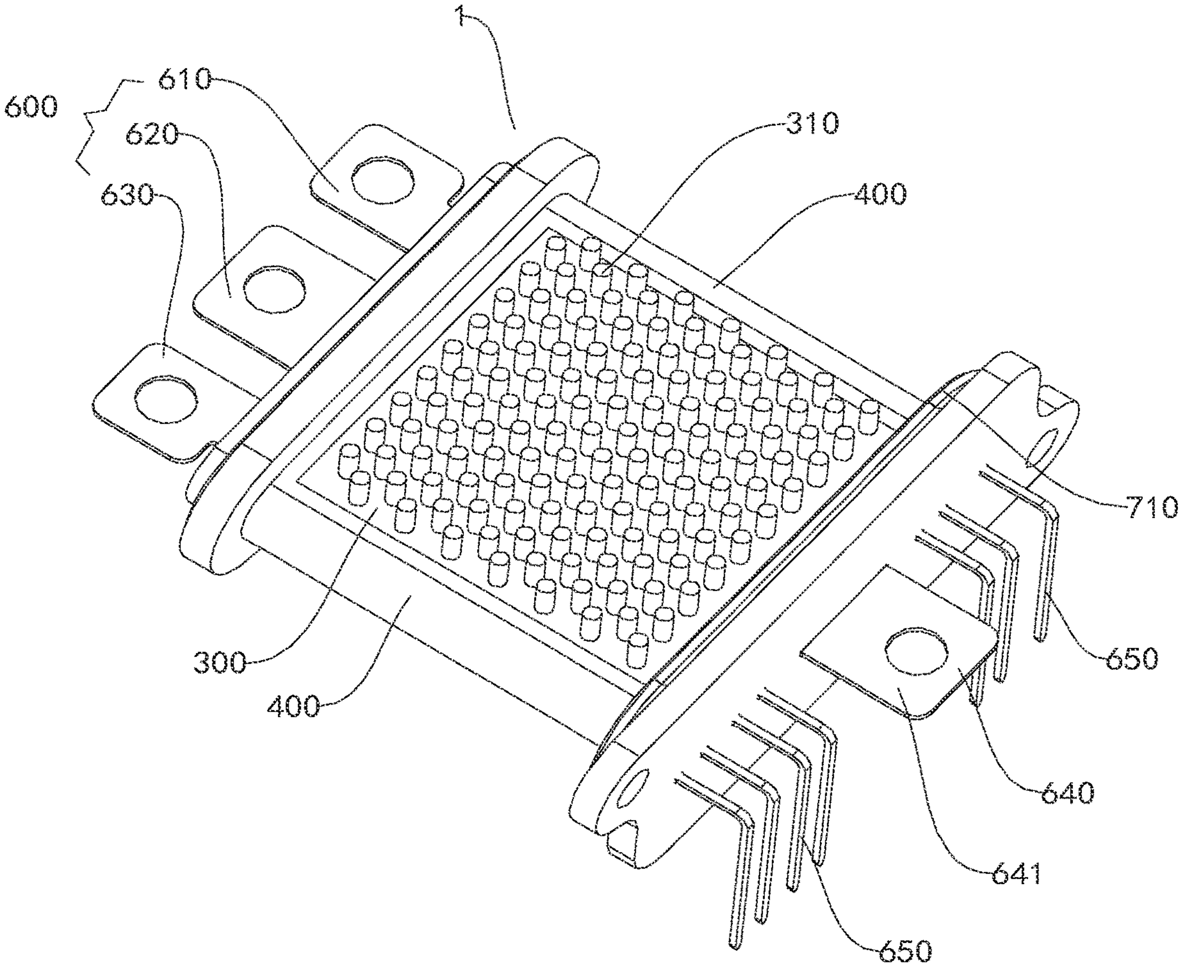
FIG. 2 is a schematic structural diagram of an IGBT module from another perspective according to an embodiment of the present disclosure.

IGBT module 1, motor controller 2,
wafer 100,
first heat dissipation plate 200, first heat dissipation pin 210, limiting groove 220, first sunk groove 230,
second heat dissipation plate 300, second heat dissipation pin 310, support rib 320, limiting rib 321, bent portion 322, accommodating cavity 330, second sunk groove 340,
insulating waterproof housing 400, annular groove 410,
first insulating and thermally-conductive sheet 500, second insulating and thermally-conductive sheet 510,
direct-current connection member 600, first direct-current negative input copper bar 610, direct-current positive input copper bar 620, second direct-current negative input copper bar 630, alternating-current connection member 640, alternating-current output copper bar 641, signal lead 650,
axial waterproof member 700, radial waterproof member 710,
liquid-cooling housing 800, cooling cavity 810, lead-in hole 811, lead-out hole 812, limiting ring edge 813, slope 814, liquid gap 820,
IGBT upper bridge arm 910, diode upper bridge arm 920, IGBT lower bridge arm 930, and diode lower bridge arm 940.

DETAILED DESCRIPTION

The embodiments of the present disclosure are described below in detail.

Examples of the embodiments are shown in the accompanying drawings, and same or similar reference signs in all the accompanying drawings indicate same or similar components or components having same or similar functions. The embodiments described below with reference to the accompanying drawings are exemplary, and are merely to explain the present disclosure and cannot be construed as a limitation to the present disclosure.

In the description of the present disclosure, it should be understood that orientation or position relationships indicated by the terms such as “center”, “longitudinal”, “lateral”, “length”, “width”, “thickness”, “upper”, “lower”, “front”, “back”, “left”, “right”, “vertical”, “horizontal”, “top”, “bottom”, “inside”, “outside”, “axial”, “radial”, and “circumferential” arebased on orientation or position relationships shown in the accompanying drawings, and are used only for ease and brevity of illustration and description, rather than indicating or implying that the mentioned apparatus or component must have a particular orientation or must be constructed and operated in a particular orientation. Therefore, such terms should not be construed as limiting of the present disclosure.

In the description of the present disclosure, “first feature” and “second feature” may include one or more of the features.

In the description of the present disclosure, “multiple/a plurality of” means two or more than two, and “several” means one or more.

An IGBT module/assembly 1 according to an embodiment of the present disclosure is described below with reference to the accompanying drawings.

As shown in FIG. 1 to FIG. 11, the IGBT module 1 according to this embodiment of the present disclosure includes a wafer 100, a first heat dissipation plate 200, a second heat dissipation plate 300, and an insulating waterproof housing 400. A wafer may include one or more semiconductor chips.

The first heat dissipation plate 200 and the second heat dissipation plate 300 are arranged/disposed on two sides/surfaces of the wafer 100 in a thickness direction of the wafer respectively. Multiple first heat dissipation pins 210 are arranged/disposed at intervals on a side/surface of the first heat dissipation plate 200 facing away from the second heat dissipation plate 300. Multiple second heat dissipation pins 310 are arranged/disposed at intervals on a side/surface of the second heat dissipation plate 300 facing away from the first heat dissipation plate 200. The insulating waterproof housing 400 covers a portion of the wafer 100 exposed from the first heat dissipation plate 200 and the second heat dissipation plate 300.

In some embodiments of the present disclosure, the insulating waterproof housing 400 may be a plastic member. The insulating waterproof housing 400 may be molded by injection molding. Furthermore, the insulating waterproof housing 400 may be connected to a portion of the first heat dissipation plate 200 on which the first heat dissipation pins 210 are not arranged. A portion of the second heat dissipation plate 300 on which the second heat dissipation pins 310 are not arranged. The insulating waterproof housing 400 covers at least the portion of the wafer 100 exposed from the first heat dissipation plate 200 and the second heat dissipation plate 300.

According to the IGBT module 1 of this embodiment of the present disclosure, the first heat dissipation plate 200 and the second heat dissipation plate 300 are arranged on two sides of the wafer 100 in the thickness direction of the wafer respectively. The multiple first heat dissipation pins 210 are arranged at intervals on the side of the first heat dissipation plate 200 facing away from the second heat dissipation plate 300. The multiple second heat dissipation pins 310 are arranged at intervals on the side of the second heat dissipation plate 300 facing away from the first heat dissipation plate 200. In this way, through the first heat dissipation plate 200 and the second heat dissipation plate 300, the wafer 100 can perform double-sided heat dissipation. That is, heat generated by the wafer 100 can be quickly dissipated through the first heat dissipation plate 200 and the second heat dissipation plate 300. Therefore, the heat dissipation effect is good. Furthermore, due to the configuration of the multiple first heat dissipation pins 210 and the multiple second heat dissipation pins 310, a contact area between the IGBT module 1 and cooling liquid can be further increased, thereby further improving the heat dissipation efficiency of the IGBT module 1.

In addition, the insulating waterproof housing 400 covers the portion of the wafer 100 exposed from the first heat dissipation plate 200 and the second heat dissipation plate 300. For example, the first heat dissipation plate 200 and the second heat dissipation plate 300 can cover the two opposite sides of the wafer 100 in the thickness direction of the wafer. Moreover, a side of the wafer 100 in a circumferential direction can be covered by the insulating waterproof housing 400, so that the sealing performance of the IGBT module 1 is improved, thereby further improving the waterproof performance of the IGBT module 1, and increasing the electrical connection reliability of the IGBT module 1. Furthermore, the insulating waterproof housing 400 can be connected to the wafer 100, the first heat dissipation plate 200, and the second heat dissipation plate 300. That is, the stability of relative positions of the wafer 100, the first heat dissipation plate 200, and the second heat dissipation plate 300 is improved.

Besides, the first heat dissipation plate 200 and the second heat dissipation plate 300 may be metal members. The metal member can shield electromagnetic interference caused by large current when the wafer 100 works, which is beneficial to improving an electromagnetic compatibility (EMC) effect.

Therefore, The IGBT module 1 according to this embodiment of the present disclosure not only can perform the double-sided heat dissipation with a high heat dissipation efficiency, but also has the advantages of reliable connection, good sealing effect, and the like.

According to some embodiments of the present disclosure, the insulating waterproof housing 400 is a nano injection-molded part which has the advantages of simple machining, low cost, light weight, and high overall structural strength. Moreover, the nano injection-molded insulating waterproof housing 400 has a better sealing effect on the wafer 100. Besides, the insulating waterproof housing 400 is nano injection-molded, with no need of additional mechanical connection structures to fix the first heat dissipation plate 200 and the second heat dissipation plate 300, so that the IGBT module 1 can become thinner and smaller. Furthermore, both the first heat dissipation plate 200 and the second heat dissipation plate 300 may be aluminum alloy members. The aluminum alloy members have good heat dissipation performance, which can further improve the heat dissipation effect of the first heat dissipation plate 200 and the second heat dissipation plate 300 on the wafer 100. In addition, thermal treatment for the aluminum alloy member is easy, so that the aluminum alloy member is easier to implement nano injection molding of the insulating waterproof housing 400.

Figure 3:
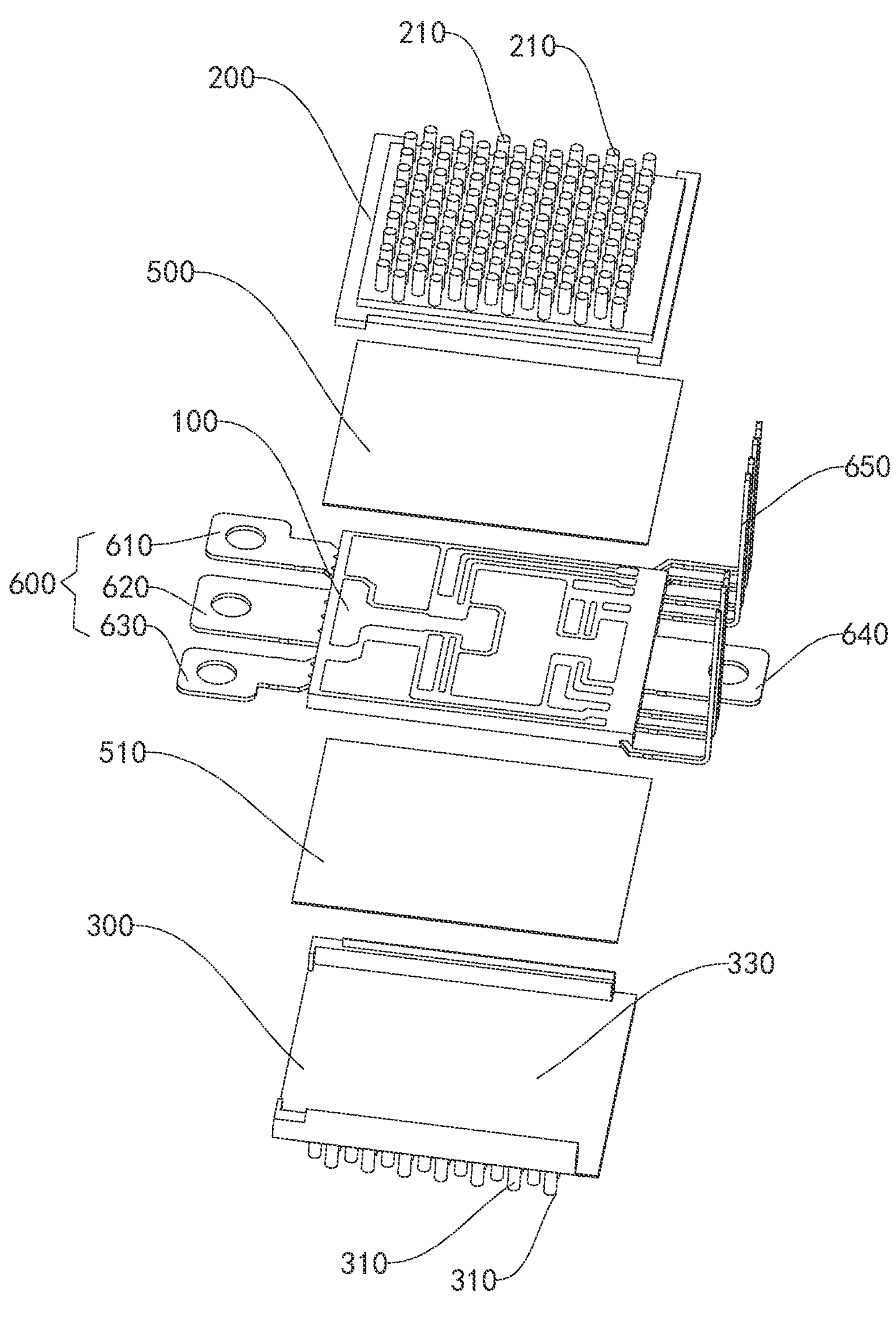
FIG. 3 is an exploded view of an IGBT module according to an embodiment of the present disclosure.
Figure 4:
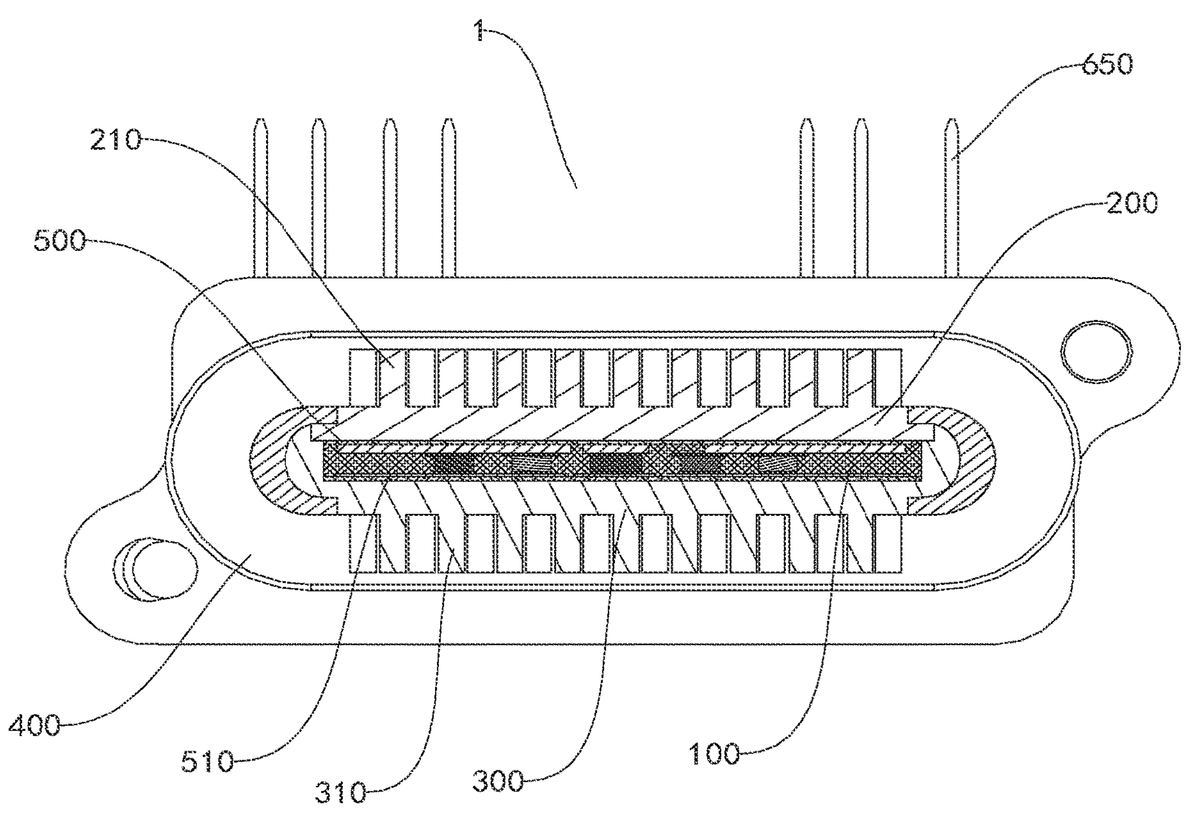
FIG. 4 is a sectional view of an IGBT module according to an embodiment of the present disclosure.
Figure 5:
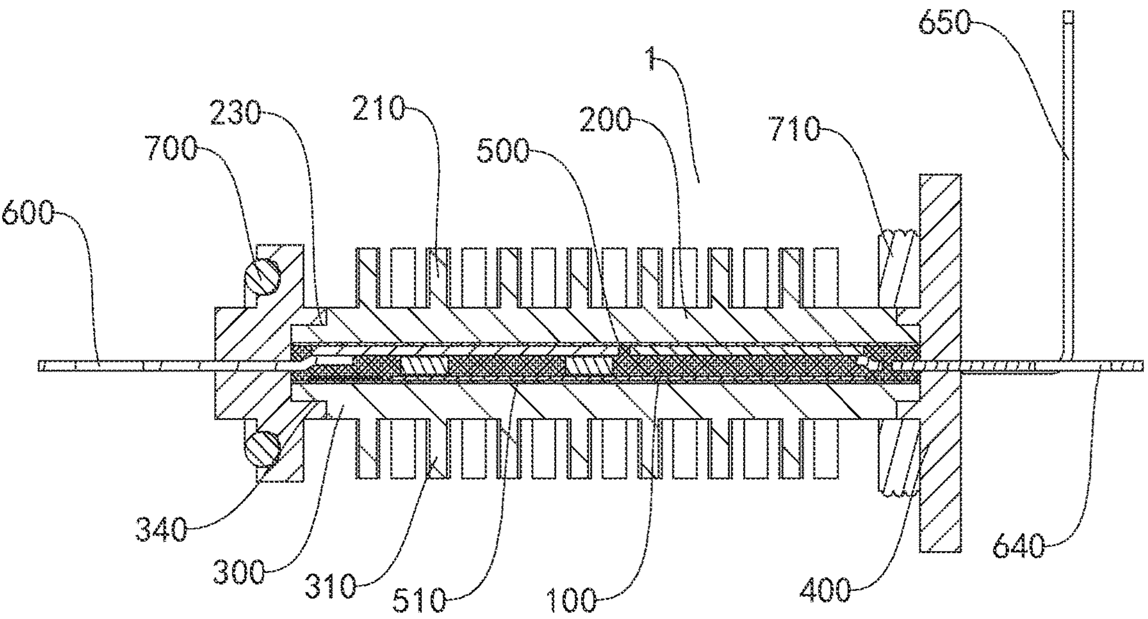
FIG. 5 is another sectional view of an IGBT module according to an embodiment of the present disclosure.

According to some embodiments of the present disclosure, as shown in FIG. 3 to FIG. 5, a first insulating and thermally-conductive sheet 500 is arranged/disposed between the first heat dissipation plate 200 and the wafer 100. A second insulating and thermally-conductive sheet 510 is arranged/disposed between the second heat dissipation plate 300 and the wafer 100.

In some embodiments of the present disclosure, the first insulating and thermally-conductive sheet 500 and the second insulating and thermally-conductive sheet 510 are located on two opposites sides of the wafer 100 in the thickness direction of the wafer. The first insulating and thermally-conductive sheet 500 is clamped by the first heat dissipation plate 200 and a surface of the wafer 100 in the thickness direction. The second insulating and thermally-conductive sheet 510 is clamped by the second heat dissipation plate 300 and another surface of the wafer 100 in the thickness direction.

The first insulating and thermally-conductive sheet 500 can avoid electrical communication between the wafer 100 and the first heat dissipation plate 200, and meanwhile conduct heat on the side of the wafer 100 in the thickens direction to the first heat dissipation plate 200 to dissipate the heat. The second insulating and thermally-conductive sheet 510 can avoid electrical communication between the wafer 100 and the second heat dissipation plate 300, and meanwhile conduct heat on another side of the wafer 100 in the thickens direction to the second heat dissipation plate 300 to dissipate the heat. In this way, both good electrical connection safety and high heat dissipation efficiency are achieved.

According to some embodiments of the present disclosure, as shown in FIG. 1 to FIG. 5, a direct-current connection member 600 is connected to one end (e.g., a first end) of the wafer 100, and an alternating-current connection member 640 is connected to another end (e.g., a second end) of the wafer 100. The direct-current connection member 600 and the alternating-current connection member 640 protrude from two opposite sides of the insulating waterproof housing 400 respectively.

In this way, the direct-current connection member 600 and the alternating-current connection member 640 are arranged/disposed at two ends of the wafer 100. Moreover, both the direct-current connection member 600 and the alternating-current connection member 640 are located outside the insulating waterproof housing 400, which not only can avoid mutual interference between the direct-current connection member 600 and the alternating-current connection member 640, and be beneficial to improving the EMC, but also can facilitate electrical connection between the wafer 100 and other electrical components of a vehicle.

In some embodiments of the present disclosure, as shown in FIG. 1 to FIG. 5, the direct-current connection member 600 includes a first direct-current negative input copper bar 610, a direct-current positive input copper bar 620, and a second direct-current negative input copper bar 630. The alternating-current connection member 640 includes an alternating-current output copper bar 641. A signal lead 650 is further arranged at another end (e.g., the second end) of the wafer 100. This not only facilitates electrical connection, but also can avoid mutual interference between direct-current and alternating-current.

Figure 11:
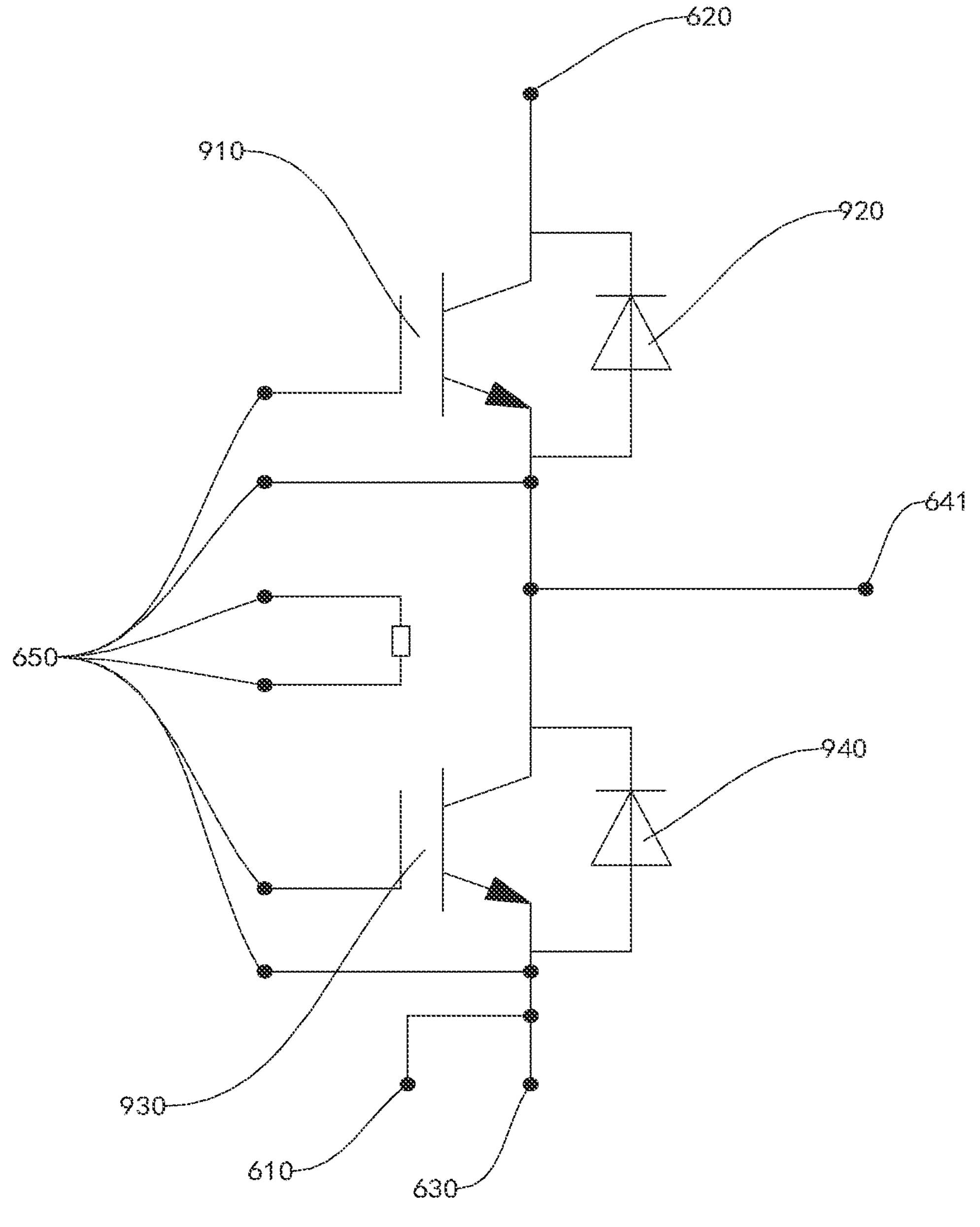
FIG. 11 is a schematic diagram of a circuit of an IGBT module according to an embodiment of the present disclosure.

With reference to FIG. 11, a current conversion process of the IGBT module 1 is illustrated with an example:

a vehicle has structures such as a direct-current power supply, a control board, a diode, a driver board, and a motor.

A positive pole of the direct-current power supply of the vehicle is connected to the direct-current positive input copper bar 620. A negative pole of the direct-current power supply of the vehicle is connected to the first direct-current negative input copper bar 610 and the second direct-current negative input copper bar 630. The first direct-current negative input copper bar 610, the direct-current positive input copper bar 620, and the second direct-current negative input copper bar 630 conduct direct-current from the direct-current power supply to an IGBT upper bridge arm 910, a diode upper bridge arm 920, an IGBT lower bridge arm 930, a diode lower bridge arm 940, so as to be converted into alternating-current. The alternating-current is then input into the motor of the vehicle through the alternating-current output copper bar 641. A signal of the IGBT module 1 during the working process of converting the direct-current to the alternative current, a temperature rise induction signal, and the like can be transmitted to the control board via the driver board through the signal lead 650.

Figure 6:
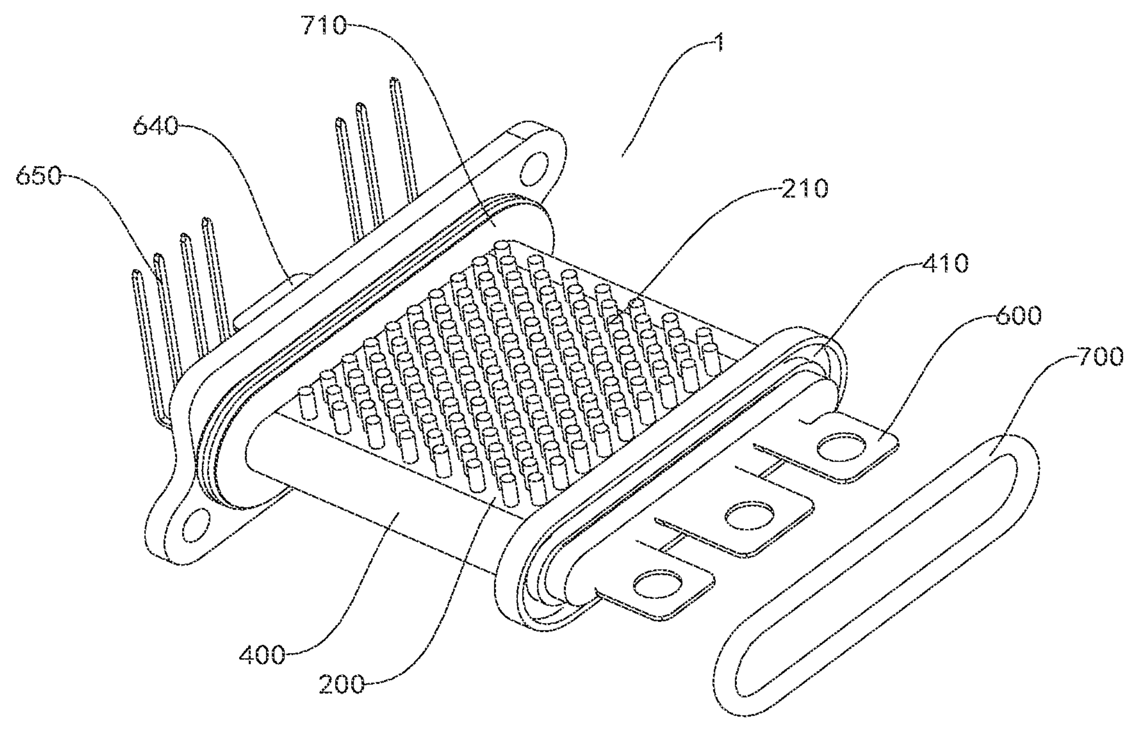
FIG. 6 is a schematic diagram of assembly of an axial waterproof member of an IGBT module according to an embodiment of the present disclosure.

In some embodiments of the present disclosure, as shown in FIG. 5 and FIG. 6, the IGBT module 1 further includes an axial waterproof member 700 and a radial waterproof member 710.

The axial waterproof member 700 is arranged/disposed on an end face of an end (e.g., a first side) of the insulating waterproof housing 400. The radial waterproof member 710 is arranged/disposed on an outer circumferential surface of another end (e.g., a second side) of the insulating waterproof housing 400 and extends along a circumferential direction of the outer circumferential surface. The axial waterproof member 700 may be an O-shaped sealing ring.

In some embodiments of the present disclosure, the axial waterproof member 700 is arranged/disposed at an end of the IGBT module 1 adjacent to the direct-current connection member 600. The axial waterproof member 700 is attached to a limiting ring edge 813 of a liquid-cooling housing 800 described below, thereby realizing the sealing of the end of the IGBT module 1 adjacent to the direct-current connection member 600. The radial waterproof member 710 is arranged/disposed around an end of the IGBT module 1 adjacent to the alternating-current connection member 640. The radial waterproof member 710 is attached to an inner wall surface of the liquid-cooling housing 800 described below, thereby realizing the sealing of the end of the IGBT module 1 adjacent to the alternating-current connection member 640. Therefore, both ends of the IGBT module 1 have a good waterproof effect.

In some embodiments of the present disclosure, an end face of an end (e.g., the first side) of the insulating waterproof housing 400 is configured with an annular groove 410. The axial waterproof member 700 is assembled in the annular groove 410. The radial waterproof member 710 and the insulating waterproof housing 400 are integrally molded.

It is to be understood that the annular groove 410 can provide an installation space for the axial waterproof member 700, so as to ensure installation stability of the axial waterproof member 700, and to prevent the axial waterproof member 700 from being separated from the IGBT module 1 due to excessive deformation. The axial waterproof member 700 partially protrudes from the annular groove 410, so that the axial waterproof member 700 can be deformed and sealed when being attached to the limiting ring edge 813 described below. In addition, the radial waterproof member 710 and the insulating waterproof housing 400 are integrally injection-molded. In this way, connection strength between the radial waterproof member 710 and the insulating waterproof housing 400, the first heat dissipation plate 200, and the second heat dissipation plate 300 is higher, the machining and molding is easier, and the radial waterproof member 710 can have a better sealing effect.

Figure 7:
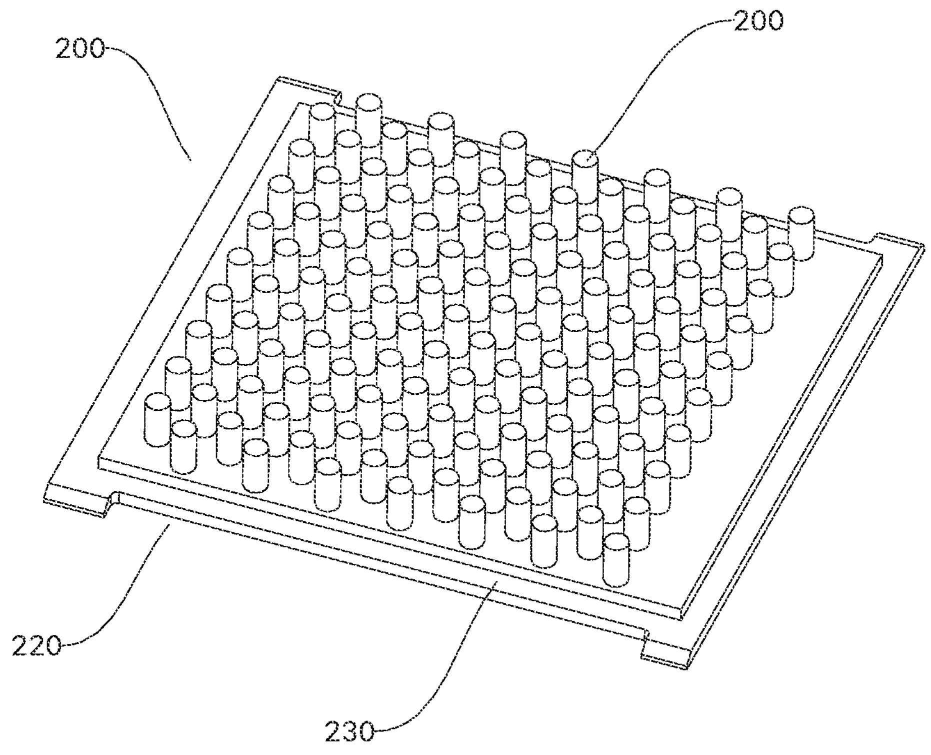
FIG. 7 is a schematic structural diagram of a first heat dissipation plate of an IGBT module according to an embodiment of the present disclosure.
Figure 8:
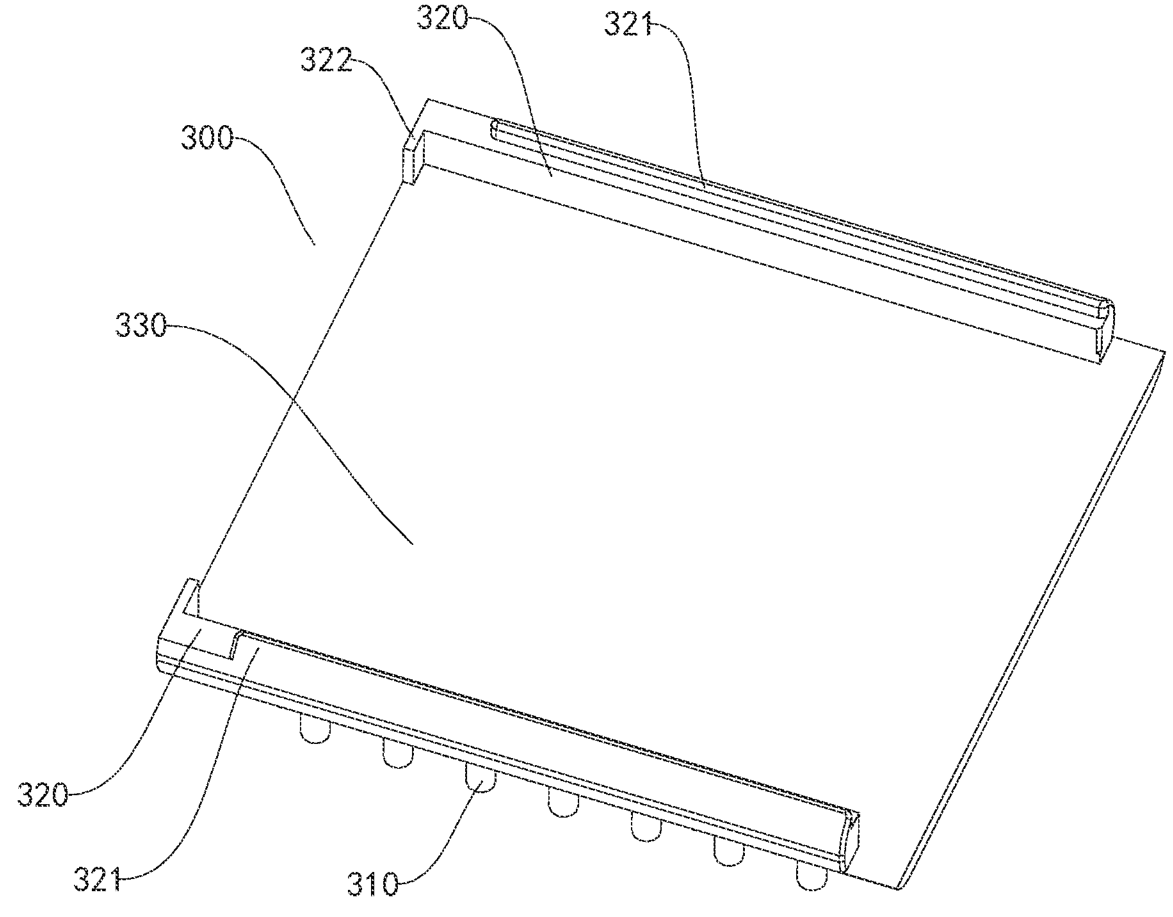
FIG. 8 is a schematic structural diagram of a second heat dissipation plate of an IGBT module according to an embodiment of the present disclosure.

According to some embodiments of the present disclosure, as shown in FIG. 7 and FIG. 8, at least one of the first heat dissipation plate 200 and the second heat dissipation plate 300 is provided with support ribs 320. The support ribs 320 are supported between the first heat dissipation plate 200 and the second heat dissipation plate 300, so as to form an accommodating cavity 330 between the first heat dissipation plate 200 and the second heat dissipation plate 300. The wafer 100 is arranged/disposed in the accommodating cavity 330. The accommodating cavity 330 can be configured in a shape suitable for the wafer 100.

Due to the configuration of the accommodating cavity 330, the wafer 100 can be installed. Moreover, the first heat dissipation plate 200 and the second heat dissipation plate 300 can protect the wafer 100 from being damaged by extrusion.

In some embodiments of the present disclosure, as shown in FIG. 7 and FIG. 8, the support ribs 320 are arranged/disposed on one of the first heat dissipation plate 200 and second heat dissipation plate 300. The support ribs 320 are provided with limiting ribs 321 extending along a length direction of the support rib. A width of the limiting rib 321 is less than a width of the support rib 320. Limiting grooves 220 are provided in the other one of the first heat dissipation plate 200 and the second heat dissipation plate 300. The limiting ribs 321 are matched/coupled with the limiting grooves 220.

In some embodiments of the present disclosure, the support ribs 320 may be arranged/disposed on two opposite edge portions of the second heat dissipation plate 300. The limiting ribs 321 are arranged/disposed on the support ribs 320. The limiting grooves 220 may be arranged/disposed on two opposite edges of the first heat dissipation plate 200. The two limiting ribs 321 are matched with the two limiting grooves 220 in one-to-one correspondence.

Through the cooperation of the limiting ribs 321 and the limiting grooves 220, relative positions of the first heat dissipation plate 200 and the second heat dissipation plate 300 in a circumferential direction, a length direction, and a width direction of the first heat dissipation plate 200 can be prefixed, which avoids shaking between the first heat dissipation plate 200 and the second heat dissipation plate 300, and is convenient to connect the insulating waterproof housing 400 to the first heat dissipation plate 200 and the second heat dissipation plate 300 through nano injection molding.

In some embodiments of the present disclosure, as shown in FIG. 7 and FIG. 8, the support ribs 320 are arranged on two opposite edges of the second heat dissipation plate 300 and extend along a length direction of the edges on which the support ribs are located. An end (e.g., a first end) of each support rib 320 is configured with a bent portion 322 extending along an edge (e.g., a first edge) of the second heat dissipation plate adjacent to the two opposite edges of the second heat dissipation plate on which the support rib is located. Another end (e.g., a second end) of each support rib 320 is spaced apart from an edge (e.g., a second edge) of the second heat dissipation plate adjacent to the two opposite edges of the second heat dissipation plate on which the support rib is located.

In some embodiments of the present disclosure, the support ribs 320 may be spaced apart from the alternating-current connection member 640 and the direct-current connection member 600, so as to avoid affecting connection of the alternating-current connection member 640 and the direct-current connection member 600 to the wafer 100 inside the accommodating cavity 330.

In addition, the bent portion 322 may be arranged/disposed at an end of the support rib 320 adjacent to the alternating-current connection member 640. The bent portion 322 not only can improve the structural strength of the support rib 320, but also can limit the wafer 100 in a width direction of the wafer 100 at the same time. Moreover, the signal lead 650 is arranged at an end (e.g., the second end) of the wafer 100 facing the direct-current connection member 600. Since the signal lead 650 occupies a large space, by configuring another end of each support rib 320 to be spaced apart from an edge adjacent to the edge on which the support rib is located, interference between the support rib 320 and the signal lead 650 can be avoided, and the installation is more convenient.

According to some embodiments of the present disclosure, as shown in FIG. 7 and FIG. 8, a first sunk groove 230 is provided in a surface of the first heat dissipation plate 200 facing away from the second heat dissipation plate 300. The first sunk groove 230 extends along a circumferential direction of an outer circumference of the first heat dissipation plate 200. A second sunk groove 340 is provided in a surface of the second heat dissipation plate 300 facing away from the first heat dissipation plate 200. The second sunk groove 340 extends along a circumferential direction of an outer circumference of the second heat dissipation plate 300. The insulating waterproof housing 400 is fitted in first sunk groove 230 and the second sunk groove 340.

In some embodiments of the present disclosure, the first sunk groove 230 is recessed from the surface of the first heat dissipation plate 200 facing away from the second heat dissipation plate 300 towards the second heat dissipation plate 300. The second sunk groove 340 is recessed from the surface of the second heat dissipation plate 300 facing away from the first heat dissipation plate 200 towards the first heat dissipation plate 200.

Due to the configuration of the first sunk groove 230 and the second sunk groove 340, it is convenient to position the insulating waterproof housing 400 that is injection-molded with the first sunk groove 230 and the second sunk groove 340, so as to prevent the insulating waterproof housing 400 from covering the first heat dissipation pins 210 of the first heat dissipation plate 200 and the second heat dissipation pins 310 of the second heat dissipation plate 300, thereby achieving a good heat dissipation effect and a good positioning effect.

According to some embodiments of the present disclosure, an outer surface of the wafer 100 is coated with the insulating heat dissipation layer (not shown).

In some embodiments of the present disclosure, the insulating heat dissipation layer is made of insulating heat dissipation resin. The insulating heat dissipation layer covers a circumferential edge of the wafer 100, which can ensure heat dissipation performance of the wafer 100 while preventing the wafer 100 from electrically communicating with external objects, thereby improving the circuit reliability.

A motor controller 2 according to an embodiment of the present disclosure is described below.

According to this embodiment of the present disclosure, the motor controller 2 includes a liquid-cooling housing 800 and an IGBT module 1.

A cooling cavity 810 is defined in the liquid-cooling housing 800. The liquid-cooling housing 800 is provided with a liquid inlet (not shown) and a liquid outlet (not shown) in communication with the cooling cavity 810. A lead-in hole 811 and a lead-out hole 812 are provided in two opposite side walls of the cooling cavity 810 respectively. The IGBT module 1 is inserted into the cooling cavity 810 through the lead-in hole 811 and extends out of the cooling cavity 810 through the lead-out hole 812. A liquid gap 820 is formed between an inner wall of the cooling cavity 810 and each of two opposite side surfaces of the IGBT module 1 in a thickness direction of the IGBT assembly. Both ends of the IGBT module 1 are sealed with the liquid-cooling housing 800 to close the lead-in hole 811 and the lead-out hole 812.

In some embodiments of the present disclosure, the liquid-cooling housing 800 may be configured into a cuboid by die-casting in cooperation with machining. The IGBT module 1 is provided with the wafer 100 with large heat generation between the direct-current connection member 600 and the alternating-current connection member 640. The IGBT module 1 achieves a waterproof effect by covering the insulating waterproof housing 400 between the direct-current connection member 600 and the alternating-current connection member 640. The alternating-current connection member 640 extends out of the lead-in hole 811 of the liquid-cooling housing 800. The direct-current connection member 600 extends out of the lead-out hole 812 of the liquid-cooling housing 800. The wafer 100 is located in the cooling cavity 810.

Cooling liquid enters the liquid-cooling housing 800 through the liquid inlet. The cooling liquid flows into the cooling cavity 810 and passes through the liquid gap 820, and flows out through the liquid outlet after cooling the IGBT module 1. In this way, the two opposite sides of the IGBT module 1 in the thickness direction are fully soaked in the cooling liquid. The portion of the IGBT module 1 that generates more heat has a larger contact cooling area with the cooling liquid, thereby realizing the double-sided heat dissipation.

Furthermore, the two ends of the IGBT module 1 are sealed with the liquid-cooling housing 800, so as to form a closed cooling liquid flow path between the liquid-cooling housing 800 and the IGBT module 1, thereby sealing the lead-in hole 811 and the lead-out hole 812 used for inserting the IGBT module 1. Therefore, the liquid-cooling housing 800 may be one-piece, without additional welding and other connection processes, which realizes a simpler production process and lower cost. The liquid-cooling housing 800 can adapt to the IGBT module 1 with a higher power density. The purpose of improving power of the IGBT module 1 is achieved.

The motor controller 2 according to this embodiment of the present disclosure employs an IGBT module 1 according to the foregoing embodiment of the present disclosure, which not only can perform the double-sided heat dissipation with a high heat dissipation efficiency, but also has the advantages of reliable connection, good sealing effect, and the like.

Figure 9:
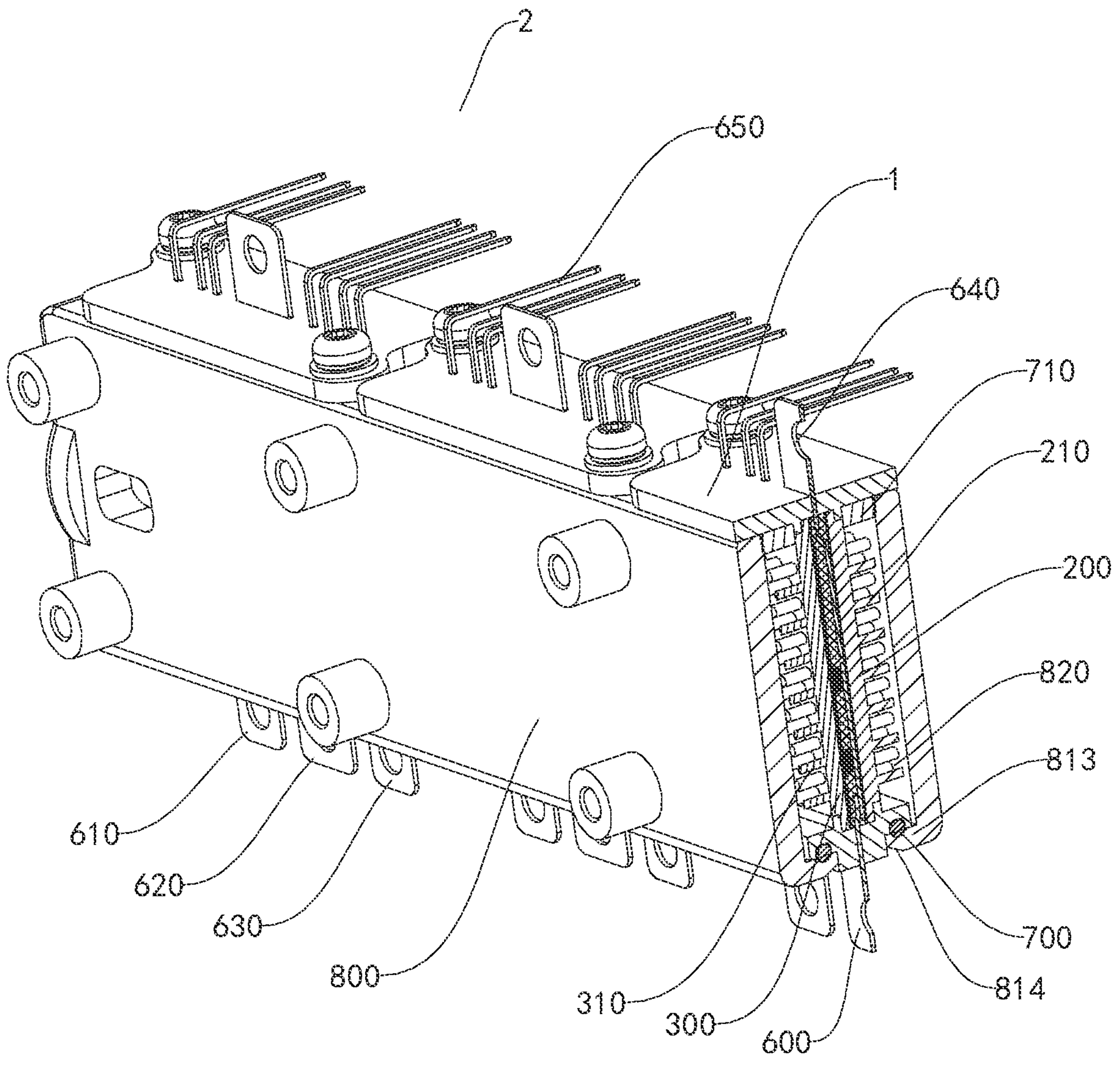
FIG. 9 is a schematic diagram of assembly of an IGBT module and a liquid-cooling housing according to an embodiment of the present disclosure.
Figure 10:
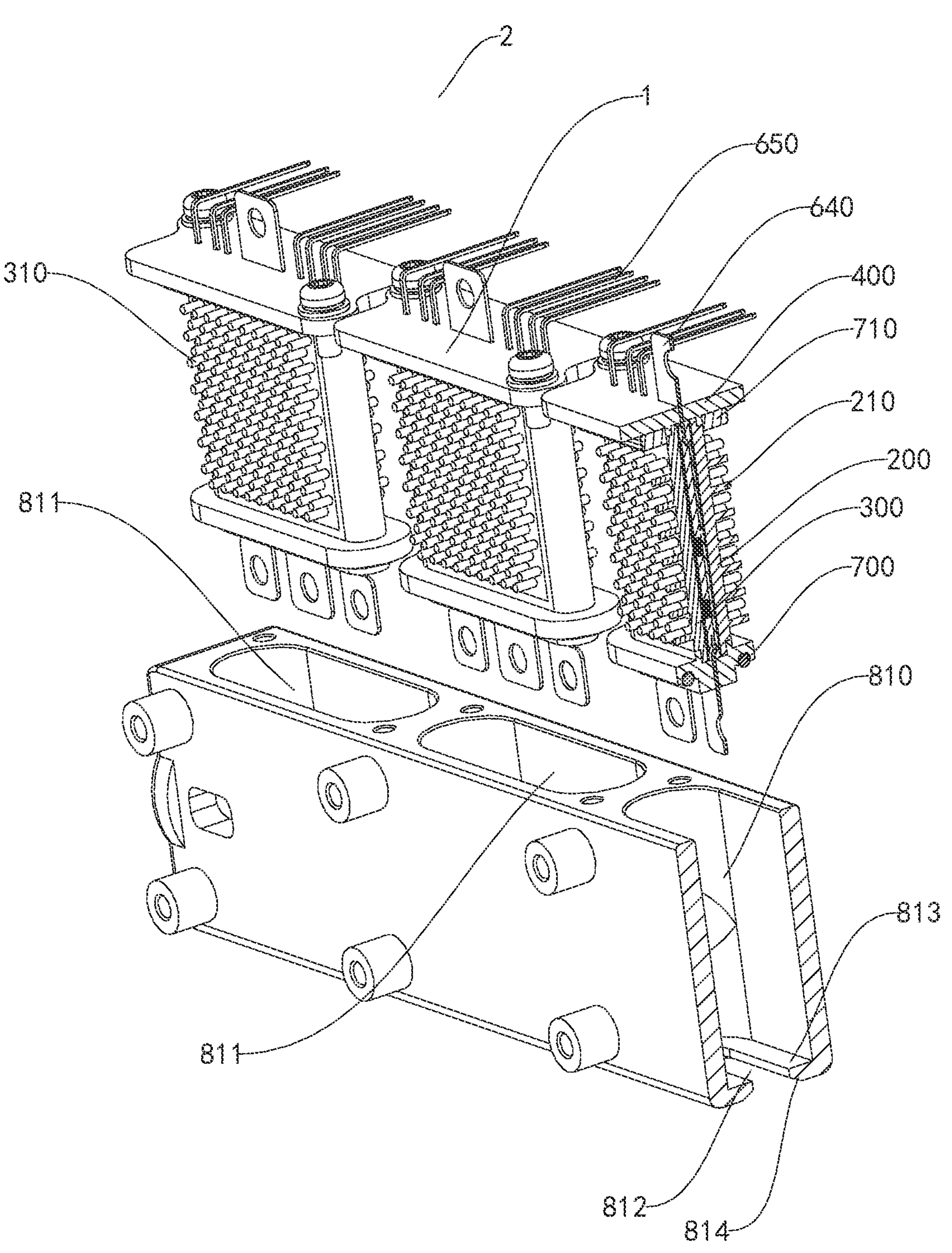
FIG. 10 is an exploded view of an IGBT module and a liquid-cooling housing according to an embodiment of the present disclosure.

According to some embodiments of the present disclosure, as shown in FIG. 9 and FIG. 10, an inner circumferential wall surface of the lead-out hole 812 is configured with a limiting ring edge 813 extending along a circumferential direction of the lead-out hole. One end of the IGBT module 1 abuts against the limiting ring edge 813 and sealed with the limiting ring edge 813, and another end of the IGBT module 1 is sealed with an inner circumferential wall surface of the lead-in hole 811.

For example, the axial waterproof member 700 of the IGBT module 1 may be in interference fit with the limiting ring edge 813. The radial waterproof member 710 of the IGBT module 1 is in interference fit with the inner circumferential wall surface of the lead-in hole 811.

The limiting ring edge 813 may block the IGBT module 1 at the lead-out hole 812, to prevent the IGBT module 1 from being separated from the liquid-cooling housing 800 through the lead-out hole 812. Therefore, the limiting ring edge 813 can play a role in positioning the IGBT module 1. Besides, the axial waterproof member 700 can be matched/coupled with a side of the limiting ring edge 813 facing the IGBT module 1, to prevent the cooling liquid from flowing out of the lead-out hole 812, facilitating sealing between the IGBT module 1 and the liquid-cooling housing 800 at the lead-out hole 812.

According to some embodiments of the present disclosure, as shown in FIG. 9 and FIG. 10, a slope 814 is arranged/configured on a surface of the liquid-cooling housing 800 in which the lead-out hole 812 is provided. The slope 814 is arranged/configured around the lead-out hole 812. The slope 814 is gradually inclined towards an interior of the cooling cavity 810 along a direction towards the lead-out hole 812.

The slope 814 may be arranged/configured on a side of the limiting ring edge 813 facing away from the IGBT module 1, so that the slope 814 is integrated with the limiting ring edge 813, reducing structural complexity of the liquid-cooling housing 800, and improving the production efficiency.

For example, the liquid-cooling housing 800 is formed by metal die casting. Due to the configuration of the slope 814 around the lead-out hole 812, an electrical distance between the direct-current connection member 600 and the liquid-cooling housing 800 can be increased to avoid problems such as short circuit, thereby meeting the electrical safety requirements. Furthermore, the liquid-cooling housing 800 made of metal can play a role in shielding the wafer 100, which further avoids electromagnetic interference caused by large current when the motor controller 2 works, and is beneficial to improving an electromagnetic compatibility (EMC) effect.

According to some embodiments of the present disclosure, as shown in FIG. 9 and FIG. 10, there are multiple cooling cavities 810. The multiple cooling cavities 810 are arranged/disposed along a length direction of the liquid-cooling housing 800. The liquid inlet, the multiple cooling cavities 810, and the liquid outlet communicate in sequence. The multiple lead-in holes 811 are provided in a side surface of the liquid-cooling housing 800 in a width direction. The multiple lead-out holes 812 are provided in another side surface of the liquid-cooling housing 800 in the width direction. When there are multiple IGBT modules 1, the multiple IGBT modules 1 are inserted into the multiple cooling cavities 810 in one-to-one correspondence through the multiple lead-in holes 811, and protrude from the multiple cooling cavities 810 through the multiple lead-out holes 812, respectively.

For example, the multiple cooling cavities 810 may be arranged in a straight line. The cooling liquid may sequentially flow into each cooling cavity 810 from the liquid inlet, and finally flows out of the liquid outlet. In each cooling cavity 810, heat of the corresponding IGBT module 1 is dissipated through the cooling liquid. The cooling liquid sequentially flows into the multiple cooling cavities 810, so that the cooling liquid performs full heat exchange with the IGBT modules 1 in the multiple cooling cavities 810, such that the cooling liquid can be efficiently used.

In addition, the liquid inlet and the liquid outlet may be located in two ends of the liquid-cooling housing 800 respectively. The cooling liquid flows in a length direction of the liquid-cooling housing 800. Therefore, the cooling liquid flows more smoothly in the multiple cooling cavities 810. Moreover, the cooling liquid flows along the length direction of the liquid-cooling housing 800, so that the cooling liquid can flow through a long distance to achieve the effect of sufficient cooling. The IGBT module 1 is inserted and installed along a width direction of the liquid-cooling housing 800, which is matched with a flow direction of the cooling liquid, so that the cooling liquid can fully flow through the two opposite side surfaces of the IGBT module 1 in the thickness direction.

In some embodiments, the flow direction of the cooling liquid along an interior of the liquid-cooling housing 800 can be adjusted, and the liquid inlet and the liquid outlet are not limited to be provided at two opposite ends of the liquid-cooling housing 800. The liquid inlet and the liquid outlet may also be located at a same end of the liquid-cooling housing 800. The locations of the liquid inlet and the liquid outlet at the liquid-cooling housing in the embodiment can be matched to the flow direction of the cooling liquid.

A vehicle according to an embodiment of the present disclosure is described below.

The vehicle according to this embodiment of the present disclosure includes a motor controller 2 according to the foregoing embodiment of the present disclosure.

The vehicle according to this embodiment of the present disclosure, by employing the motor controller 2 according to the foregoing embodiment of the present disclosure, has the advantages of good heat dissipation, reliable electrical connection, and the like.

In some embodiments of the present disclosure, there are other configurations and operations of the IGBT module 1, the motor controller 2, and the vehicle, which will not be described in detail herein.

In the description of this specification, description of reference terms such as "specific embodiment", "specific example", and the like means including features, structures, materials, or characteristics described in the embodiment or example in at least one embodiment or example of the present disclosure. In this specification, exemplary descriptions of the foregoing terms do not necessarily refer to the same embodiment or example.

Although the embodiments of the present disclosure have been shown and described, a person of ordinary skill in the art should understand that various changes, modifications, replacements, and variations may be made to the embodiments without departing from the principles and spirit of the present disclosure, and the scope of the present disclosure is as defined by the appended claims and their equivalents.

What is claimed is:

1. An insulated gate bipolar transistor (IGBT) assembly, comprising:

a wafer, a first heat dissipation plate and a second heat dissipation plate being disposed on two surfaces of the wafer in a thickness direction of the wafer respectively, a plurality of first heat dissipation pins being disposed at an interval from each other on a surface of the first heat dissipation plate facing away from the second heat dissipation plate, and a plurality of second heat dissipation pins being disposed at an interval from each other on a surface of the second heat dissipation plate facing away from the first heat dissipation plate, and an insulating waterproof housing covering a portion of the wafer exposed from the first heat dissipation plate and the second heat dissipation plate, an axial waterproof member disposed on an end face of a first side of the insulating waterproof housing and extending along an axial direction of the end face, and a radial waterproof member disposed on an outer circumferential surface of a second side of the insulating waterproof housing and extending along a circumferential direction of the outer circumferential surface of the second side of the insulating waterproof housing.

2. The IGBT assembly according to claim 1, further comprising:

a first insulating and thermally-conductive sheet disposed between the first heat dissipation plate and the wafer; and a second insulating and thermally-conductive sheet disposed between the second heat dissipation plate and the wafer.

3. The IGBT assembly according to claim 1, further comprising:

a direct-current connection member connected to a first end of the wafer and protruding from the first side of the insulating waterproof housing, and an alternating-current connection member connected to a second end of the wafer and protruding from the second side of the insulating waterproof housing.

4. The IGBT assembly according to claim 3, wherein the direct-current connection member comprises a first direct-current negative input copper bar, a direct-current positive input copper bar, and a second direct-current negative input copper bar;

the alternating-current connection member comprises an alternating-current output copper bar; and a signal lead is disposed at the second end of the wafer.

5. The IGBT assembly according to claim 1, wherein an annular groove is formed in the end face of the first side of the insulating waterproof housing, and the axial waterproof member is disposed in the annular groove; and the radial waterproof member and the insulating waterproof housing are integrally molded.

6. The IGBT assembly according to claim 1, wherein at least one of the first heat dissipation plate and the second heat dissipation plate comprises support ribs, the support ribs are disposed between the first heat dissipation plate and the second heat dissipation plate, to form an accommodating cavity between the first heat dissipation plate and the second heat dissipation plate, and the wafer is disposed in the accommodating cavity.

7. The IGBT assembly according to claim 6, wherein the support ribs are disposed on one of the first heat dissipation plate and the second heat dissipation plate, a limiting rib is disposed on each of the support ribs and extends along a length direction of a support rib, a width of the limiting rib is less than a width of a support rib, the other one of the first heat dissipation plate and the second heat dissipation plate comprises limiting grooves, and the limiting ribs are coupled with the limiting grooves.

8. The IGBT assembly according to claim 6, wherein the support ribs are disposed on two opposite edge portions of the second heat dissipation plate and extend along a length direction of the two opposite edge portions; and a first end of each of the support ribs is configured with a bent portion extending along a first edge of the second heat dissipation plate adjacent to the two opposite edge portions of the second heat dissipation plate on which the support rib is located, and a second end of each of the support ribs is spaced from a second edge of the second heat dissipation plate adjacent to the two opposite edge portions of the second heat dissipation plate on which the support rib is located.

9. The IGBT assembly according to claim 1, wherein a first sunk groove is formed in the surface of the first heat dissipation plate facing away from the second heat dissipation plate, and the first sunk groove extends along a circumferential direction of an outer circumference of the first heat dissipation plate;

a second sunk groove is formed in the surface of the second heat dissipation plate facing away from the first heat dissipation plate, and the second sunk groove extends along a circumferential direction of an outer circumference of the second heat dissipation plate; and the insulating waterproof housing is fitted in the first sunk groove and the second sunk groove.

10. The IGBT assembly according to claim 1, wherein an outer surface of the wafer is coated with an insulating heat dissipation layer.

11. A motor controller, comprising:

a liquid-cooling housing, a cooling cavity being defined in the liquid-cooling housing, the liquid-cooling housing comprising a liquid inlet and a liquid outlet in communication with the cooling cavity, and a lead-in hole and a lead-out hole being disposed in two opposite side walls of the cooling cavity, respectively; and an insulated gate bipolar transistor (IGBT) assembly being inserted into the cooling cavity through the lead-in hole and extended out of the cooling cavity through the lead-out hole, a liquid gap being formed between an inner wall of the cooling cavity and one of two opposite side surfaces of the IGBT assembly in a thickness direction of the IGBT assembly, and two ends of the IGBT assembly being sealed with the liquid-cooling housing to close the lead-in hole and the lead-out hole, wherein the IGBT assembly comprises:

a wafer, a first heat dissipation plate and a second heat dissipation plate being disposed on two surfaces of the wafer in a thickness direction of the wafer respectively, a plurality of first heat dissipation pins being disposed at an interval from each other on a surface of the first heat dissipation plate facing away from the second heat dissipation plate, and a plurality of second heat dissipation pins being disposed at an interval from each other on a surface of the second heat dissipation plate facing away from the first heat dissipation plate, and an insulating waterproof housing covering a portion of the wafer exposed from the first heat dissipation plate and the second heat dissipation plate.

12. The motor controller, according to claim 11, wherein the IGBT assembly further comprises:

a first insulating and thermally-conductive sheet disposed between the first heat dissipation plate and the wafer; and a second insulating and thermally-conductive sheet disposed between the second heat dissipation plate and the wafer.

13. The motor controller, according to claim 11, wherein the IGBT assembly further comprises:

a direct-current connection member connected to a first end of the wafer and protruding from a first side of the insulating waterproof housing, and an alternating-current connection member connected to a second end of the wafer and protruding from a second side of the insulating waterproof housing.

14. The motor controller, according to claim 13, wherein the direct-current connection member comprises a first direct-current negative input copper bar, a direct-current positive input copper bar, and a second direct-current negative input copper bar;

the alternating-current connection member comprises an alternating-current output copper bar; and a signal lead is disposed at the second end of the wafer.

15. The motor controller, according to claim 11, wherein the IGBT assembly further comprises:

an axial waterproof member disposed on an end face of a first side of the insulating waterproof housing, and extending along an axial direction of the end face; and a radial waterproof member disposed on an outer circumferential surface of a second side of the insulating waterproof housing, and extending along a circumferential direction of the outer circumferential surface.

16. The motor controller, according to claim 15, wherein an annular groove is formed in the end face of the first side of the insulating waterproof housing, and the axial waterproof member is disposed in the annular groove; and the radial waterproof member and the insulating waterproof housing are integrally molded.

17. The motor controller, according to claim 11, wherein at least one of the first heat dissipation plate and the second heat dissipation plate comprises support ribs, the support ribs are disposed between the first heat dissipation plate and the second heat dissipation plate, to form an accommodating cavity between the first heat dissipation plate and the second heat dissipation plate, and the wafer is disposed in the accommodating cavity.

18. The motor controller, according to claim 17, wherein the support ribs are disposed on one of the first heat dissipation plate and the second heat dissipation plate, a limiting rib is disposed on each of the support ribs and extends along a length direction of the support rib, a width of the limiting rib is less than a width of a support rib, the other one of the first heat dissipation plate and the second heat dissipation plate comprises limiting grooves, and the limiting ribs are coupled with the limiting grooves.

19. A vehicle, comprising: a motor controller comprising:

a liquid-cooling housing, a cooling cavity being defined in the liquid-cooling housing, the liquid-cooling housing comprising a liquid inlet and a liquid outlet in communication with the cooling cavity, and a lead-in hole and a lead-out hole being disposed in two opposite side walls of the cooling cavity, respectively; and an insulated gate bipolar transistor (IGBT) assembly being inserted into the cooling cavity through the lead-in hole and extended out of the cooling cavity through the lead-out hole, a liquid gap being formed between an inner wall of the cooling cavity and one of two opposite side surfaces of the IGBT assembly in a thickness direction of the IGBT assembly, and two ends of the IGBT assembly being sealed with the liquid-cooling housing to close the lead-in hole and the lead-out hole, wherein the IGBT assembly comprises:

a wafer, a first heat dissipation plate and a second heat dissipation plate being disposed on two surfaces of the wafer in a thickness direction of the wafer respectively, a plurality of first heat dissipation pins being disposed at an interval from each other on a surface of the first heat dissipation plate facing away from the second heat dissipation plate, and a plurality of second heat dissipation pins being disposed at an interval from each other on a surface of the second heat dissipation plate facing away from the first heat dissipation plate, and an insulating waterproof housing covering a portion of the wafer exposed from the first heat dissipation plate and the second heat dissipation plate.

* * * * *